United States Patent [19]

Fowler

[11] 3,849,204

[45] Nov. 19, 1974

[54] PROCESS FOR THE ELIMINATION OF INTERFACE STATES IN MIOS STRUCTURES

[75] Inventor: Alan Bicksler Fowler, Yorktown, N.Y.

[73] Assignee: International Business Machines Corporation, Armonk, N.Y.

[22] Filed: June 29, 1973

[21] Appl. No.: 375,283

[52] U.S. Cl. .................................... 148/1.5, 29/571
[51] Int. Cl. ............................................. H01l 7/54
[58] Field of Search ................ 148/1.5; 29/576, 571

[56] References Cited

UNITED STATES PATENTS

| | | | |
|---|---|---|---|
| 3,386,163 | 6/1968 | Brennemann et al. | 148/1.5 X |
| 3,513,035 | 5/1970 | Fitzgerald et al. | 148/1.5 |

*Primary Examiner*—L. Dewayne Rutledge
*Assistant Examiner*—Arthur J. Steiner
*Attorney, Agent, or Firm*—Thomas J. Kilgannon, Jr.; John J. Goodwin

[57] ABSTRACT

Under circumstances where interface states have been formed in an interface region between a layer of silicon dioxide and an underlying silicon substrate, and where processing temperatures have been encountered which would cause out-diffusion of hydrogen, a special problem arises in the presence of insulating layers such as silicon nitride and aluminum oxide layers which are impervious to the diffusion of gases such as hydrogen at lower temperatures which are usually encountered in the final fabrication steps of an integrated circuit device. Because hydrogen, for example, cannot be diffused at the lower temperatures through impervious insulation layers, steps of the present process such as implanting hydrogen ions in the interface region and annealing for a time and temperature sufficient to substantially eliminate interface states are utilized. With respect to the ion species utilized, it should be one that is capable of entering the lattice structure of silicon forming a bond therewith with dangling bonds which have not been completely filled by oxygen from the silicon dioxide layer. Ion implanted hydrogen is of such character that it is capable of entering the lattice. The annealing step is carried out in an inert atmosphere for a time and temperature sufficient to substantially eliminate interface states.

13 Claims, 5 Drawing Figures

INITIAL STATE

IMPLANTATION

ANNEALING

INITIAL STATE
BEFORE IMPLANTATION

AFTER IMPLANTATION
AND ANNEALING

PROCESS FOR THE ELIMINATION OF INTERFACE STATES IN MIOS STRUCTURES

BACKGROUND OF THE INVENTION

1. Field of the Invention

This invention relates generally to methods for eliminating interface states, the presence of which in a finally fabricated device can have deleterious effects on the operating characteristics of a field effect transistor device, for example. More specifically, it relates to a method for eliminating interface states in MIOS (metal-insulator-oxide-semiconductor) devices wherein the insulator is made of a aluminum oxide or silicon nitride and is impervious to the introduction of materials which could eliminate interface states because sufficiently high temperatures cannot be utilized in the final stages of fabrication of such devices without disturbing previously achieved desirable conditions. The present invention introduces an ion species such as hydrogen by ion implantation to replace hydrogen which was outdiffused during high temperature portions of the overall semiconductor fabrication process. After implanting, the semiconductor wafer or silicon substrate is annealed at a termperature and for a time sufficient to substantially eliminate interface states which were present as a result of the out-diffusion of hydrogen. As a result of the present process, substantially greater drain current flows in field effect devices formed in the semiconductor substrate after implanting and annealing than prior to implantation when interface states were present.

2. Description of the Prior Art

The presence of interface states and their deleterious effect on the operation of field effect transistors has been a concern in the fabrication of field effect transistors for some time. Various techniques have been suggested for eliminating or reducing interface or surface states. For example, U.S. Pat. 3,386,163 entitled Method For Fabricating Insulated Gate Field Effect Transistors, issued June 4, 1968 to A. E. Brennemann et al., and assigned to the same assignee as the present application, shows a method which includes diffusing aluminum oxide into a silicon dioxide layer and thereafter annealing while applying an electric field to a metallic gate to control space charge effects along the conduction channel. In this patent, the aluminum oxide is completely diffused into the silicon oxide layer and no barrier is presented to the introduction of hydrogen. In another exmaple, U.S. Pat. No. 3,590,477 entitled Method For Fabricating Insulated Gate Field Effect Transistors Having Controlled Operating Characteristics, issued to G. Cheroff et al., on July 6, 1971 and assigned to the same assignee as the present invention, shows a fabrication process for insulated gate field effect transistors wherein the operating characteristics are controlled by heating in air a field effect transistor with its gate metallization already formed at a temperature between 300° and 500°C. The effect of this heating or annealing step in air is to control or eliminate surface states. In the patented process, sufficiently high temperatures are reached to cause out-diffusion of materials which caused the existence of surface states. Heat treating at relatively low temperatures is alright, in this instance, because there is no material like silicon nitride or aluminum oxide present to prevent the passage of an ion specie such as hydrogen through the silicon dioxde layer. In the present application, such a low temperature heating step in air would be ineffective due to the presence of insulating layers of silicon nitride or aluminum oxide which are impervious to the diffusion of gases therethrough at the relatively low temperatures which must be used to prevent the changing of previously generated desired conditions.

SUMMARY OF THE INVENTION

The present invention generally relates to a method for ion implanting a desired ion species into an interface region between the surface of a semiconductor substrate and an overlying layer of oxide in the presence of an insulating layer which is normally pervious to the diffusion of gases therethrough only at relatively high temperatures. The method of the present invention, in its broadest aspect, comprises the steps of forming an oxide layer on a surface of a silicon substrate; the forming step generating interface states at an interface region between the oxide layer and the silicon substrate.

After forming the oxide layer, a layer of insulating material which is permeable to the diffusion of gases through it only at high temperatures is formed on the surface of the oxide layer. The oxide and insulating layer covered substrate is then subjected to the step of implanting an ion species which is capable of entering the lattice of the silicon substrate at the interface region. In a final step, annealing is carried out for a time and at temperature sufficient to substantially eliminate the interface states.

In accordance with more particular aspects of the present invention, the fabrication processing includes the step of forming a layer of metal such as aluminum on at least a portion of the insulating layer prior to the ion implanting step.

In accordance with still more specific aspects of the present invention, the oxide forming step includes the step of thermally oxidizing the silicon substrate to form a layer of silicon dioxide. Also, the step of forming a layer of insulating material includes the step of depositing from the vapor phase one of the materials, silicon nitride or aluminum oxide.

In accordance with still more specific aspects of the present invention, the step of implanting includes the step of implanting hydrogen ions in sufficient quantity to create an ion density at the interface in a range of $1-10 \times 10^{13}$ ions per $cm^2$. .

In yet more specific aspects of the present process, the step of annealing in an inert atmosphere includes the step of annealing in nitrogen for ½ - 1 hour in a temperature range of 450°–600°C. Using the process steps recited hereinabove, individual devices or integrated circuits which incorporate insulating layers which are normally impervious to the diffusion of material at relatively low temperatures may be fabricated without subjecting an almost completed device to high temperature steps which might ordinarily be required to cause the diffusion of hydrogen, for example, through the insulating layer and deleteriously affect both the structure and the electrical characteristics of the resulting device or integrated circuit.

It is, therefore, an object of the present invention to provide a method for substantially eliminating surface states at an interface region between a layer of oxide and an underlying silicon substrate without subjecting an almost completely fabricated device or integrated circuit to an untimely high temperature processing step.

Another object is to provide a method for eliminating interface or surface states using a low temperature process.

Another object is to provide a method for eliminating surface states which only affects the surface state characteristic of the device or integrated circuit.

The foregoing and other objects, features and advantages of the present invention will be apparent from the following more particular description of preferred process steps as illustrated in the accompanying drawings:

DESCRIPTION OF THE PREFERRED EMBODIMENT

Figure 1A:
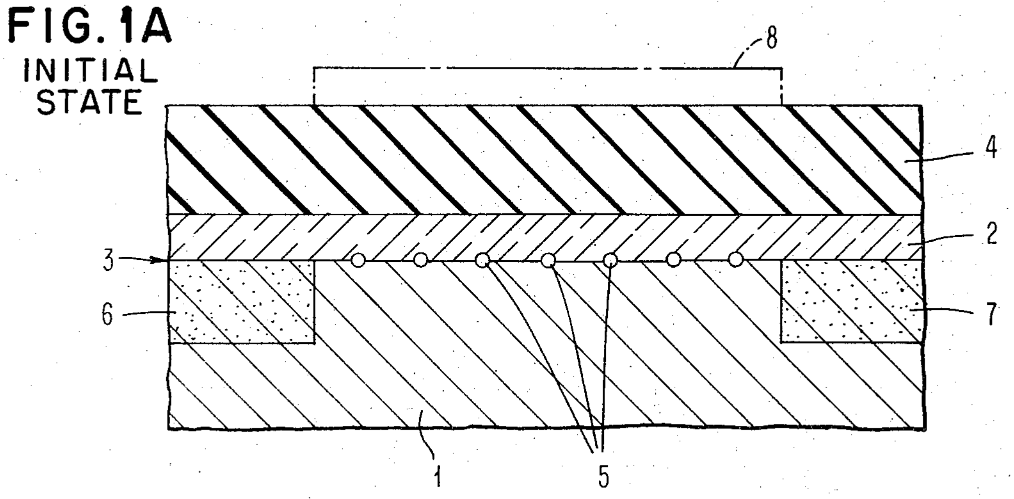
FIG. 1 is a cross sectional view of an MIOS device at a near final stage in its fabrication process. Trapping states at the $SiO_2$-Si interface are schematically shown and result from the out-diffusion of hydrogen during high temperature processing steps in the fabrication process.
FIG. 1B shows the arrangement of FIG. 1A and, in addition, shows schematically a hydrogen ion passing through an insulation layer which is normally impervious to the diffusion of hydrogen at low temperatures and through a layer of silicon dioxide. The hydrogen ions are shown approaching the schematically shown trapping or interface states.
FIG. 1C shows an arrangement similar to that shown in FIG. 1B after an annealing step which causes the hydrogen ions to enter the silicon lattice and satisfy dangling bonds thereby eliminating trapping or interface states.

In FIG. 1 there is shown a cross-sectional view of an MIOS (Metal-Insulator-Oxide-Semiconductor) device at a near final stage in its fabrication process. The device forms only a portion of what could be an array or group of such devices having memory or logic functions as in known integrated circuit arrangements. Only a single device has been shown since this is sufficient to demonstrate the novel process of the present application. In FIG. 1, an MIOS device is formed from a substrate 1 of semiconductor material such as silicon. A layer 2 of silicon dioxide or other oxide which is normally permeable to the diffusion of gases is disposed on a surface of substrate 1. In the instance where layer 2 is of silicon dioxide, layer 2 is normally formed by a thermal oxidation process at temperatures of 850°–1100°C. This process is well known to those skilled in the semiconductor art at the interface 3 between layer 2 and a silicon substrate 1. In the usual MIOS devices, a layer 2 has a thickness in the range of 25–50 A. After thermally forming layer 2, an insulating layer 4 of silicon nitride ($Si_3N_4$) or aluminum oxide ($Al_2O_3$) is deposited on the surface of layer 2 by chemical vapor deposition (CVD) using deposition techniques well known to those skilled in the semiconductor fabrication art.

Typically, layer 4, when formed of silicon nitride is deposited from a gas at atmoshpheric pressure consisting of hydrogen with 30 percent by volume of ammonia and 1 percent by volume of silane ($SiH_4$) heated in the presence of substrate 1 to a temperature of 950°C. Cooling to room temperature is then carried out in a nitrogen or other inert gas atmoshphere. It is, at this point, that hydrogen escapes by diffusing through both layer 2 and layer 4 creating trapping or interface states shown schematically by circles 5 in FIG. 1A at the silicon dioxide-silicon interface 3. While the instance just described is not the only point in a typical process during which hydrogen can outdiffuse, it is exemplary of the conditions in a typical process which will permit hydrogen to diffuse from interface 3. It should be obvious, that where temperatures are sufficiently high (800°–1,000°C) hydrogen can diffuse through both layer 3 and layer 4. Another condition which can cause the formation of trapping or interface states 5 is in an oxide regrowth situation where one wishes to form thick oxide regions somewhere on a wafer or substrate and, in forming the thick oxide layer, uses temperatures of approximately 1,000°C.

The situation is no different where layer 4 is formed from aluminum oxide which, like silicon nitride, is normally pervious to the diffusion of gases through it only at relatively high temperatures. Layer 4 of aluminum oxide is typically formed by the decomposition of aluminum trichloride ($AlCl_3$) combined with carbon dioxide ($CO_2$) and hydrogen ($H_2$) in a nitrogen carrier at a temperature of 700°–1,000°C. Layer 4 is typically up to 500 A in thickness.

FIG. 1A shows a source diffusion 6 and a drain diffusion 7 which are formed by diffusing suitable semiconductor dopants well known to those skilled in the semiconductor art into substrate 1 via apertures (not shown) in layers 2 and 4 which mask substrate 1 everywhere except in the region of the apertures. Contacts (not shown) to source 6 and drain 7 are formed by well known photolithographic masking and etching techniques at the same time a gate 8 (shown in phantom in FIG. 1A) is delineated. These details which are well known to those skilled in the fabrication of semiconductor devices, have not been shown since the structure of FIG. 1A suffices to show the application of the present process in the fabrication of semiconductor devices. Thus, FIG. 1A schematically depicts an MIOS device at a nearly completed stage in its fabrication having trapping or interface states 5 located at interface 3 due to the outdiffusion of hydrogen which outdiffused during some high temperature step in the fabrication process. At this point, it should be appreciated that the nearly completed device of FIG. 1A cannot now be subjected to temperatures in the range of 900°C which would permit hydrogen to diffuse through layers 2 and 4 to satisfy the dangling silicon bonds which appear as trapping or interface state 5 at interface 3. Such high temperatures would deleteriously affect diffusions 6, 7 and melt gate 8 or alloy other metallization with silicon substrate 1. The standard annealing process which normally eliminates interface states by heating in hydrogen in a temperature range of 400°–500°C is ineffective to eliminate interface states 5 since hydrogen, at these temperatures, cannot diffuse or penetrate through layer 4.

It is, at this point, that hydrogen is implanted using $H_2^+$ ions in a standard system for ion acceleration and selection and implanted at sufficient energy so that the maximum concentration of hydrogen is near interface 3. Typically, $H_2^+$ ions at 10KV can be used for a 600 A insulator layer. Depending on the thickness of layers 3 and 4, different accelerating potentials are applied to the ion implanting arrangement and, as shown schematically in FIG. 1B, hydrogen ions ($H_2^+$) pass through layers 2 and 4 (and gate 8, if desired) to enter the lattice of silicon substrate 1 and satisfy dangling bonds in the silicon which resulted from the high temperature outdiffusion of hydrogen. The number of hydrogen ions introduced may be in a range of $2-5 \times 10^{13}$ ions per $cm^2$. The hydrogen ions are introduced into substrate 1 to a depth which is sufficient to encompass interface 3 but, in so doing, additional interface states are introduced and silicon substrate 1 is damaged where the hydrogen ions encounter it.

Figure 1B:
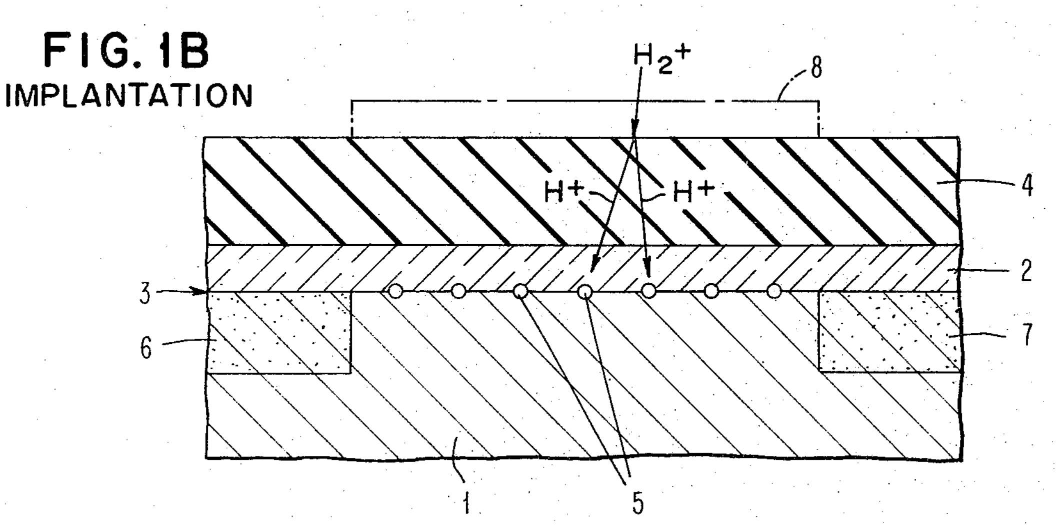
Figure 1C:
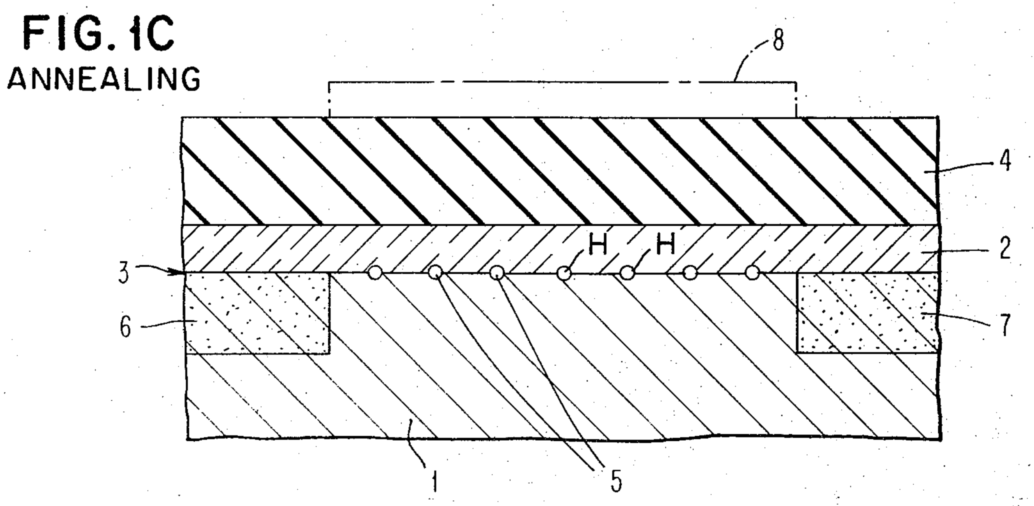

The resulting damage and the formation of additional interface states along with the already present interface states are eliminated by annealing the implanted arrangement of FIG. 1B in nitrogen or other inert gas at a temperature in the range of 450°–600°C for ½ - 1 hour. This step produces the arrangement shown in FIG. 1C where, after annealing the previously ionized hydrogen enters into the lattice of silicon substrate 1 at interface 3 satisfying dangling silicon bonds and neutralizing both the silicon and hydrogen.

Figure 2A:
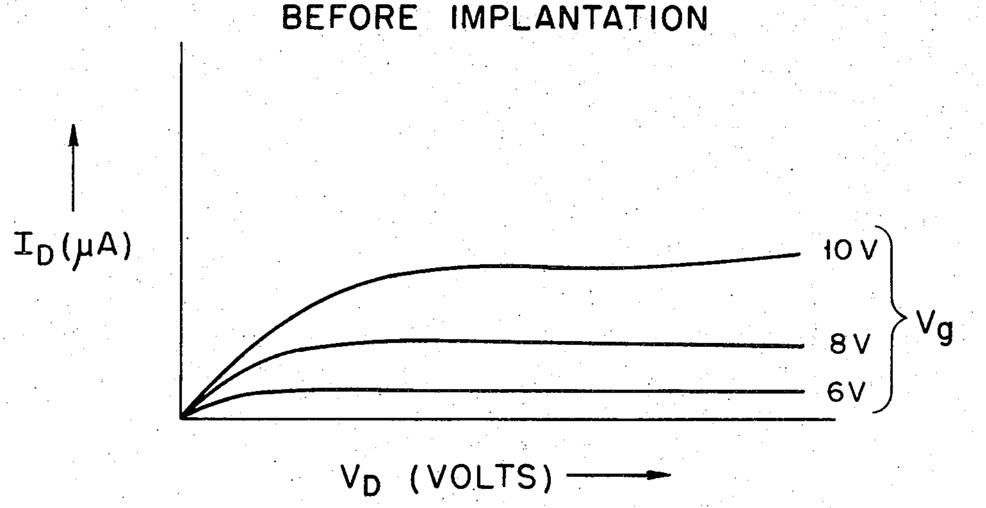
FIG. 2A shows a plot of drain current $I_D$ versus drain voltage $V_D$ at various values of gate voltage $V_G$ prior to the implantation of hydrogen at the interface between the silicon and silicon dioxide layers.
Figure 2B:
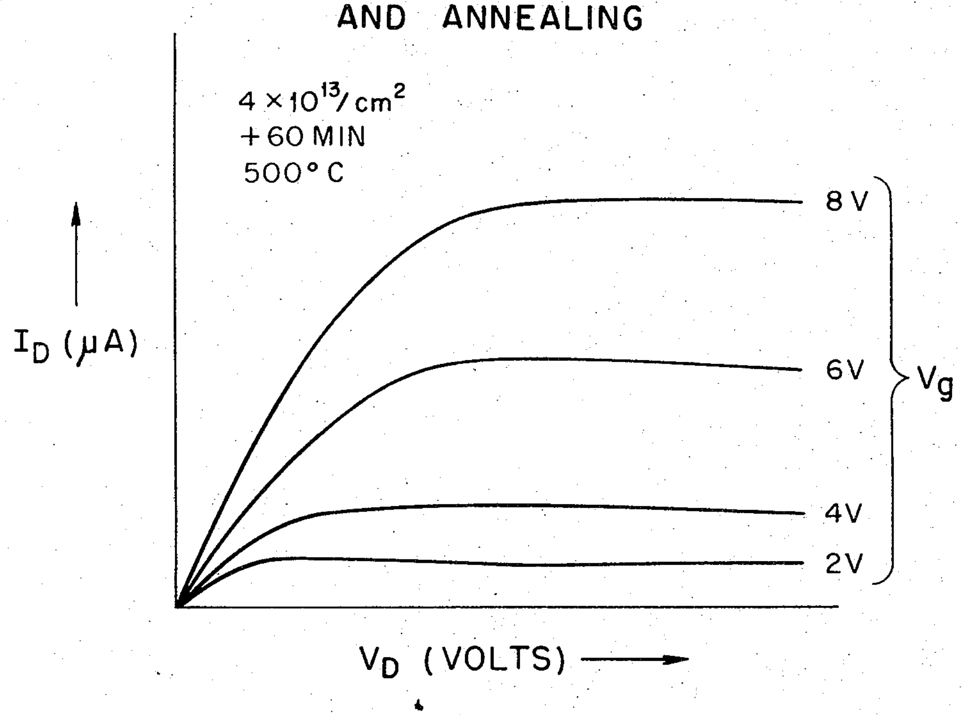
FIG. 2B shows a graph of the same parameters as indicated in connection with FIG. 2A after the implantation and annealing steps of the present invention. From this plot, it is clear that the effect of interface states has been eliminated.

The effect of ion implantation and annealing can be seen by referring to FIGS. 2A and 2B which show plots of drain current ($I_D$) versus drain voltage ($V_D$) at various gate potentials ($V_g$) before and after the implantation and annealing steps of the present invention. The device used in obtaining the plot of FIG. 2B is similar in every respect to that utilized in obtaining the plot of FIG. 2A except that the ion implanting and annealing steps have been added.

A comparison of the plots of FIG. 2A and FIG. 2B clearly shows that the threshold of the implanted and annealed device has been lowered to the extent that significant drain current is obtained at a gate voltage of 2 volts for the ion implanted and annealed device whereas significant drain current is not obtained until a gate voltage of 6 volts is applied to the device which has not undergone implantation and annealing. The same pattern is evident when further comparisons are made. For example, note that at a gate voltage of 8 volts in FIG. 2B, more than four times as much drain current flows in the implanted and annealed device as compared with the drain current of the device which has not been implanted and annealed.

From the foregoing, it should be clear that a low temperature ion implanting of hydrogen and annealing substantially eliminates interface or trapping states which appeared as a result of the outdiffusion of hydrogen during a high temperature processing step encountered in the fabrication of either integrated circuits or devices which contain layers normally impervious to the diffusion of gases at low temperatures. While hydrogen has been shown as the ion implanted specie, it should be appreciated that other ions may also be utilized provided they are capable of entering the lattice of the silicon substrate.

Finally, while no specific conductivity types have been indicated for silicon substrate 1, it should be appreciated that the present teaching is applicable to substrates which are both n and p type conductivity.

While the invention has been particularly shown and described with reference to preferred method steps thereof, it will be understood by those skilled in the art that the foregoing and other changes and details may be made therein without departing from the spirit and scope of the present invention.

What is claimed is:

1. In a fabrication process for forming semiconductor devices having a semiconductor an oxide layer on a surface of said substrate, an insulating layer on said oxide layer and have interface states at the oxide and substrate interface, said insulatingmaterial being pervious to diffusion of gases through it only at high temperatures on the surface of said oxide layer, the improvement comprising the steps of:

implanting hydrogen ions at said interface region which is capable of entering the lattice of said substrate, and annealing said substrate in an inert atmosphere for a time and temperature sufficient to substantially eliminate interface states.

2. A fabrication process according to claim 1 wherein said semiconductor substrate is silicon and said oxide layer is silicon dioxide.

3. A fabrication process according to claim 1 wherein said insulating layer consists essentially of either vapor deposited silicon or vapor deposited aluminum oxide.

4. A fabrication process according to claim 1 wherein the step of implanting includes the step of implanting hydrogen ions sufficient to create an ion density at said interface in the range of $1-10 \times 10^{13}$ ions/$cm^2$.

5. A fabrication process according to claim 1 wherein the step of annealing in an inert atmosphere includes the step of annealing in nitrogen for ½ - 1 hours in a temperature range of 450° - 600°C.

6. A fabrication process according to claim 1 further including the step of forming a layer of metal on at least a portion of said insulating layer prior to said implanting step.

7. In a low temperature process for reducing undesired interface states at an interface region between a layer of oxide on the surface of semiconductor substrate, including the step of covering said oxide layer with a layer of insulating material which is pervious to the diffusion of gases only at high temperatures, the improvement comprising the steps of:

implanting hydrogen ions through said layer of insulating material to a depth which encompasses said interface region, said ions being capable of entering the lattice of said semiconductor substrate, and, annealing for a time and temperature sufficient to substantially eliminate interface states.

8. A process according to claim 7 wherein said semiconductor substrate is silicon, said oxide is silicon oxide and said insulating material is one of silicon nitride and aluminum oxide.

9. A process according to claim 7 wherein the step of implanting includes the step of implanting hydrogen ions sufficient to create an ion density at said interface region in the range of $1-10 \times 10^{13}$ ions/$cm^2$.

10. A process according to claim 7 wherein the step of annealing includes the step of annealing in nitrogen for ½ – 1 hour in a temperature range of 450° to 600°C.

11. A process according to claim 7 further including the step of:

forming a layer of metal on at least a portion of said insulating layer prior to said implanting step.

12. In a process for reducing surface states in semiconductor devices having:

a silicon dioxide layer on the surface of a silicon substrate, interface states at an interface between said silicon dioxide layer and said substrate, a layer of insulating material selected from the group consisting of silicon nitride and aluminum oxide on the surface of said silicon dioxide layer, said insulating material being pervious to the diffusion of hydrogen only at high temperatures, the improvement comprising the steps of:

implanting hydrogen ions at said interface region which are capable of entering the lattice of said silicon substrate and, annealing said substrate in a nitrogen atmosphere for ½ – 1 hour in a temperature range of 450° – 600°C to substantially eliminate interface states.

13. A process according to claim 12 further including the step of:

forming a layer of aluminum on at least a portion of said insulating layer prior to said implanting step.

* * * * *